(12) United States Patent
Murata

(10) Patent No.: US 7,224,875 B2
(45) Date of Patent: May 29, 2007

(54) SEMICONDUCTOR OPTICAL DEVICE INTEGRATED WITH A PHOTO DETECTOR

(75) Inventor: Michio Murata, Kanagawa (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 11/042,336

(22) Filed: Jan. 26, 2005

(65) Prior Publication Data
US 2005/0185881 A1 Aug. 25, 2005

(30) Foreign Application Priority Data
Jan. 27, 2004 (JP) ............................ 2004-018741

(51) Int. Cl.
G02B 6/10 (2006.01)
H01S 3/08 (2006.01)
H01S 5/00 (2006.01)

(52) U.S. Cl. .................. 385/129; 385/130; 385/15; 385/31; 385/39; 372/29.011; 372/50.21; 372/66; 372/96; 372/99

(58) Field of Classification Search ................ 385/129; 372/29.011, 50.21, 66, 96, 99
See application file for complete search history.

(56) References Cited

U.S. PATENT DOCUMENTS 4,989,214 A * 1/1991 Kwa ........................ 372/50.21
5,023,686 A * 6/1991 Helmut et al. .............. 257/257
6,026,106 A * 2/2000 Suzuki et al. .............. 372/50.1
6,459,716 B1 * 10/2002 Lo et al. ..................... 372/50.1
6,816,531 B1 * 11/2004 Rossin et al. ................. 372/64
2003/0053506 A1 * 3/2003 Coldren ....................... 372/50

FOREIGN PATENT DOCUMENTS

| JP | 2001-208939 | 8/2001 |
|---|---|---|
| JP | 2002-223027 | 8/2002 |
| JP | 2002-299751 | 10/2002 |

* cited by examiner

Primary Examiner—Frank G. Font
Assistant Examiner—Ryan Lepisto
(74) Attorney, Agent, or Firm—Smith, Gambrell & Russell, LLP

(57) ABSTRACT

The present invention provides a semiconductor optical device 1 that includes a photodiode capable of monitoring front light of the light-emitting device. The optical device 1 includes a photodiode 3, which is formed on a substrate 7 and has an absorption layer 9 and a semiconductor layer 11, and an optical waveguide 5 also formed on the substrate 7. The optical waveguide 5 includes, in addition to the active layer 13, two semiconductor layers 15 and 17. A portion of the light from the active layer 13 enters the photodiode 3 reflected by the end surface 5a of the waveguide 5 and the rest portion of the light passes through the end surface 5a and outputs therefrom. In the present invention, the photodiode 3 and the waveguide 5 are integrally formed on the substrate 7.

13 Claims, 12 Drawing Sheets

SEMICONDUCTOR OPTICAL DEVICE INTEGRATED WITH A PHOTO DETECTOR

BACKGROUND OF THE INVENTION

1. Field of the Invention

The present invention relates to a semiconductor optical device integrated with a photo detector, particularly, a light-emitting device capable of monitoring its optical output by front light.

2. Related Prior Art

Japanese Patent Application published as 2002-299751 has disclosed a semiconductor laser diode integrated with an optical modulator type of electro-absorption device. In this application, the photodiode monitors backward light emitted from the back facet of the optical resonator of the laser diode. The laser diode of this application is currently driven by the driving signal after electrically correcting the output from the photodiode by a non-linear amplifier.

In general, an optical beam emitted from the back facet and that emitted from the front facet do not always keep their relative condition. That is, a ratio of both beams varies as the driving condition of the laser diode. Therefore, it is preferable to monitor the light emitted from the front facet.

Another Japanese Patent Application published as 2001-208939 has disclosed an optical module using a composite device, in which a laser diode and a photodiode for monitoring light emitted from the laser diode are integrated. The integrated device is mounted on a heat sink, where an optical fiber is also mounted thereon. The tip surface of the optical fiber is inclined to the optical axis thereof, accordingly light emitted from the laser diode enters the photodiode reflected by the tip surface of the optical fiber.

In the optical configuration above, although the photodiode receives the light emitted from the front face of the laser diode, an additional optical alignment between the tip surface of the optical fiber and the photodiode is necessary.

Still another Japanese Patent application published as 2002-223027 has disclosed an optical module, which includes a photodiode mounted on a substrate and a laser diode optical coupling with an optical waveguide. The photodiode receives light leaked from the core portion of the optical waveguide. In this module, the photodiode monitors light emitted from the laser diode without any optical splitting device.

In this prior art, the portion of the light emitted from the front facet of the laser diode without the optical alignment between the optical fiber and the photodiode is omitted, nor any optical splitter to split the front light. However, the light leaked from the core of the optical fiber is sensitive to the structure thereof and the driving condition of the laser diode.

Therefore, one of objects of the present invention is to provide a semiconductor optical device capable of monitoring light emitted from the front facet of the optical device in stable.

SUMMARY OF THE INVENTION

According to one aspect of the present invention, a semiconductor optical device is provided. The optical device comprises an optical detector such as photodiode, a first optical waveguide such as laser diode, and a substrate. The optical detector and the optical waveguide are integrally formed and disposed on the substrate. The optical waveguide includes first and second end surfaces, a first active layer, and an optical axis connecting the first end surface to the second end surface. The active layer generates light. The optical detector includes an absorption layer. In the present invention, a normal line of the first end surface of the optical waveguide preferably makes an angle to the optical axis such that a portion of light generated in the first active layer is reflected at the first end surface and enters the absorption layer of the optical detector. The rest portion of light passed through the first end surface. Since the optical waveguide and the optical detector are integrally formed on the substrate, not only the light emitted from the front facet of the optical waveguide may be monitored but also the optical alignment between the optical waveguide and the optical detector is not necessary.

The angle between the normal line of the first end surface and the optical axis of the optical detector is preferably greater than 3° to prevent light reflected at the first end surface from returning the optical waveguide.

The optical waveguide of the present invention may bend at a side of the first end surface such that the normal line of the first end surface makes an angle to the optical axis, while the normal line of the second end surface is in parallel to the optical axis.

In the optical device of the present invention, a photoluminescence wavelength of the first active layer is preferably shorter than that of the absorption layer, or a composition of the first active layer is substantially equal to that of the absorption layer.

The optical device of the present invention may provide a fist mesa that includes the active layer and a second mesa that includes the absorption layer. Further, a groove is preferably provided between first and second mesas to electrically isolate the first active layer and the absorption layer to each other. Or, The optical device may provide a proton-implanted region between the optical waveguide and the optical detector to each other.

The optical device of the present invention may further include a second waveguide that includes a second active layer and is integrally formed and disposed on the substrate. The second optical waveguide is preferably disposed between the first end surface and the first optical waveguide. In this case, the first send surface is included in the second optical waveguide. The second optical waveguide may function as an optical modulator. On the other hand, the first optical waveguide may operate as a light-emitting device. The composition of the second active layer may be substantially equal to that of the first active layer, and the second optical waveguide may function as an optical modulator types of elector-absorption modulator.

BRIEF DESCIPTION OF DRAWINGS

DETAILED DESCRIPTION OF PREFERRED EMBODIMENTS

The subject of the present invention will be easily understood by considering the following description with referring to accompanying drawings. Next, embodiments of the present invention will described as referring to accompanying drawings. In the explanation, same elements will be possibly referred by same symbols and numerals.

(First Embodiment)

Figure 1:
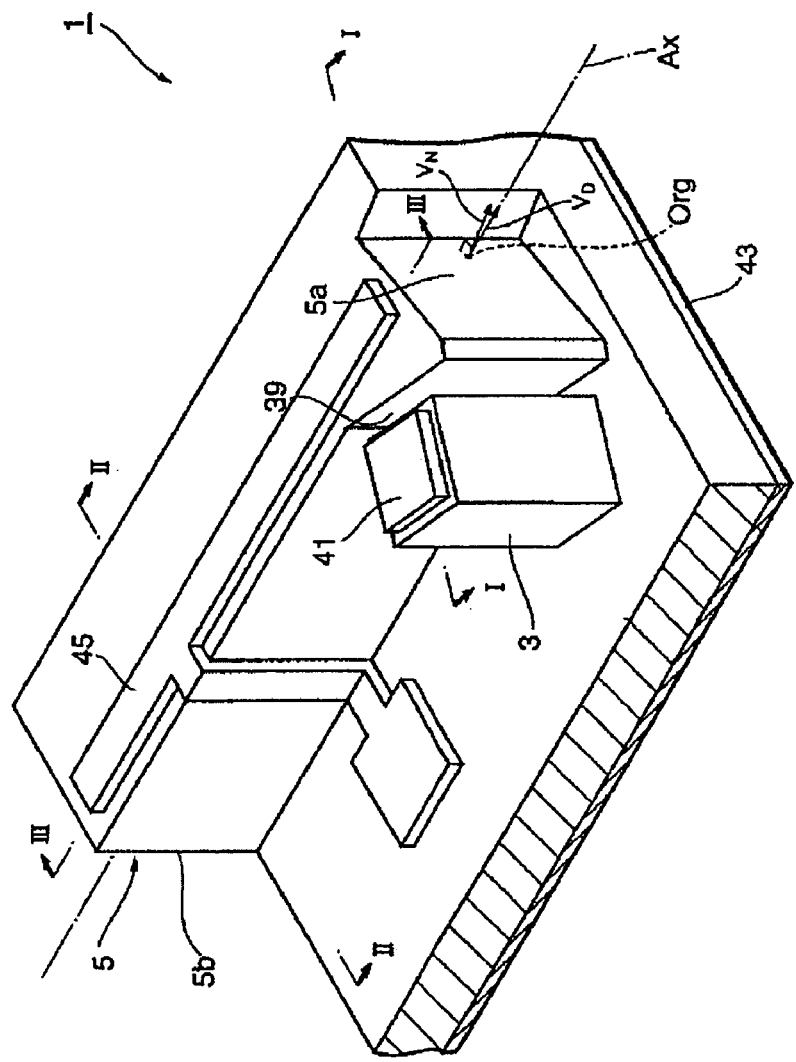
FIG. 1 is a perspective view showing a semiconductor optical device according to the first embodiment of the present invention.
Figure 2A:
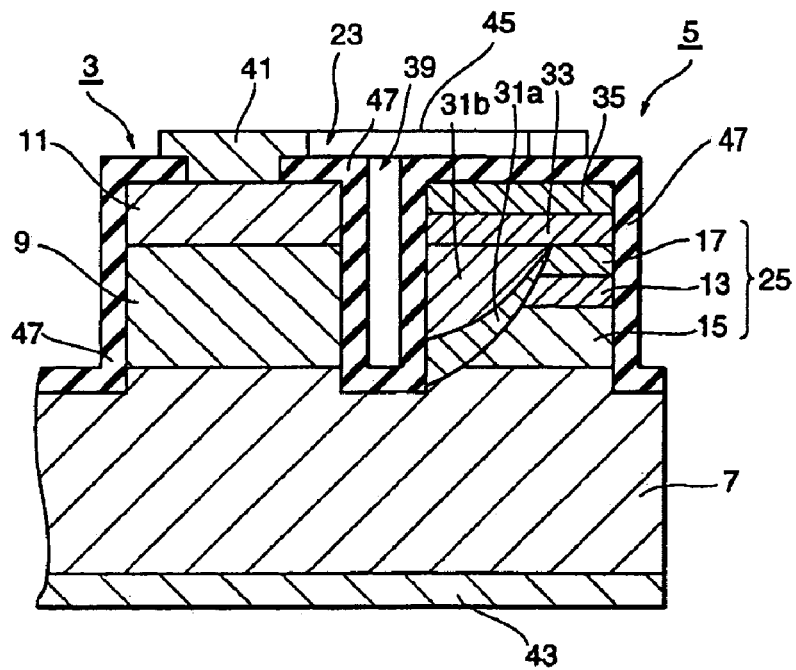
FIG. 2A is a cross sectional view of the optical device taken along the line I—I shown in FIG. 1.
Figure 2B:
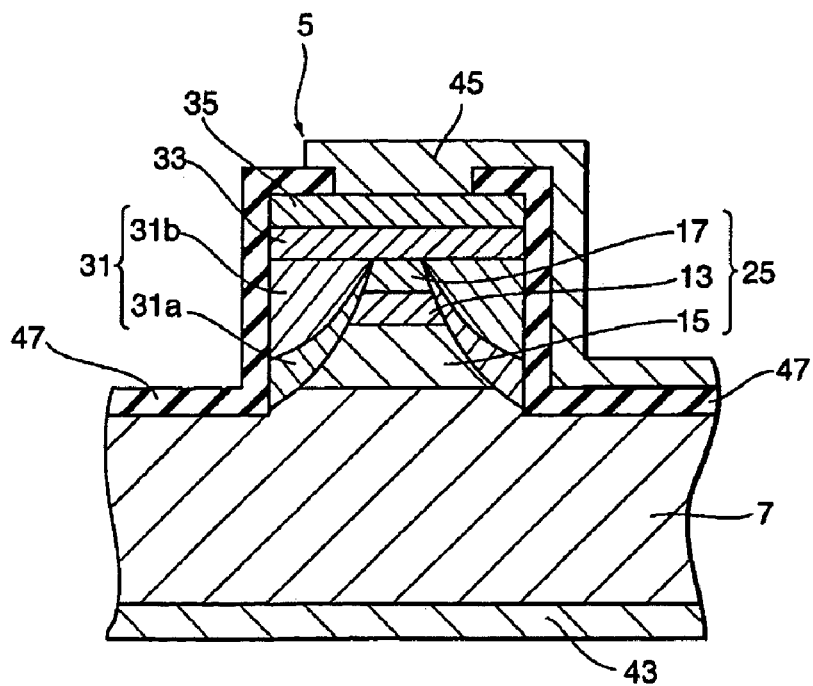
FIG. 2B is a cross sectional view of the optical device taken along the line II—II shown in FIG. 1.
Figure 3:
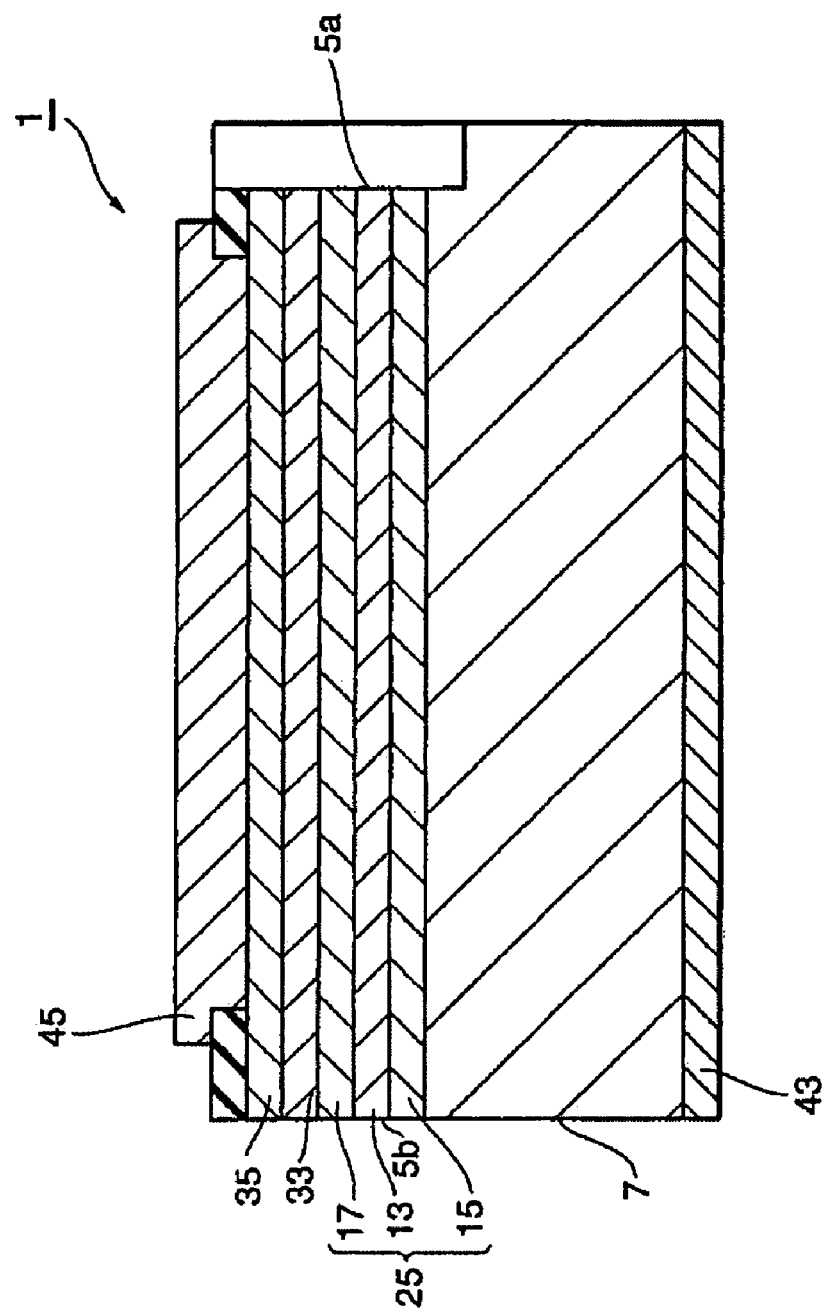
FIG. 3 is a cross sectional view of the optical device taken along the line III—III shown in FIG. 1.

FIG. 1 shows a semiconductor optical device according to the first embodiment of the present invention. FIG. 2A is a cross section taken along the line I—I in FIG. 1, while FIG. 2B is a cross section taken along the line II—II in FIG. 1. FIG. 3 is another cross section taken along the line III—III in FIG. 1.

The optical semiconductor device 1 includes an optical detector 3 and an optical waveguide 5. The optical detector 3, as shown in FIG. 2A, provides an absorption layer 9 and a semiconductor layer 11 both disposed on a substrate 7. The optical waveguide 5 has a first end surface 5a, a second end surface 5b and a first active layer 13 provided on the substrate 7. The waveguide 5, in addition to the first active layer 13, includes semiconductor layers 15 and 17. A portion of light generated in the first active layer 13 enters the optical detector 3 reflected by the first end surface 5a. Another portion of light generated in the first active layer 13 becomes an output light transmitted through the first end surface 5a. The first active layer 13 in the waveguide 5 and semiconductor layers 15 and 17 are disposed between the first and second end surfaces, 5a and 5b, respectively, such that the optical waveguide extends along an axis between first and second surfaces, 5a and 5b.

Since the present semiconductor optical device integrally includes the optical detector 3, optical alignment between the optical detector 3, i.e., the absorption layer 9 thereof, the first active layer 18 in the waveguide and the first end surface 5a as a reflecting mirror is not necessary after the manufacturing of the semiconductor device 1.

The substrate 7 may be made of n-type InP (Indium Phosphide) with a buffer layer formed on the substrate 7. The semiconductor layer 15 may be an n-type cladding layer, and the other semiconductor layer 17 may be a p-type cladding layer. The optical detector 3 may be a PIN photodiode, in which the absorption layer 9 is formed between the p-type semiconductor layer 11 and the n-type substrate 7.

A unit vector $V_N$ normal to the first end surface 5a preferably makes an angle greater that three degrees (3°) to a unit vector $V_D$ of the axis $A_X$ at the point Org to reflect the light generated in the active layer 13 in the waveguide 5 to the optical detector 3. In the preferred embodiment shown in figures, the angle between the normal line $V_N$ to the unit vector $V_D$ is set to be 8°.

In the optical waveguide 5, layers bury a mesa 25 in both sides thereof. These layers 31a and 31b are called a burying region 31 including a first layer 31a and a second layer 31b. The optical waveguide 5 may further provide other layers 33 and 35 both formed on the active layer 13. The layer 33 may be a cladding layer, while the other layer 35 may be a contact layer. The first buried layer 31a is made of p-type semiconductor, while the other buried layer 31b is made of n-type semiconductor. The layer 33, namely the cladding layer, is a p-type semiconductor, and the contact layer 35 is made of a highly doped p-type semiconductor. The burying region 31 operates to confine current in the mesa 25.

In the present embodiment, the optical detector 3 is formed in the first mesa 23 and the optical waveguide is formed in the second mesa 25 different to the first mesa 23. Thus, both devices are isolated to each other by a groove 39 gouging out the buried region 31. The passivation film 47 also covers the top and the side of both mesas 23 and 25 and, as explained below, electrodes to provide the current to the waveguide 5 and to extract the signal from the optical detector are formed on the passivation film 47.

The optical detector 3 provides a first electrode 41 formed on the absorption layer 9. A second electrode 43 is formed on the back surface of the substrate 7. On the other hand, a third electrode 45 is provided on the active layer 13 of the optical waveguide 5.

The optical waveguide 5 and two electrodes 43 and 45 may comprise a semiconductor laser diode, typically a type of the DFB (Distributed Feed-Back) laser. The third electrode 45 is an anode of the laser diode, while the second electrode 43 is a cathode thereof. Between the third electrode 45 and the second electrode 43 is applied by a bias in a forward bias condition, and light is generated in the active layer 13 as responding a signal thus applied between the third and second electrodes 43 and 45.

The optical waveguide and two electrodes 43 and 45 may comprise an optical modulator type of electro-absorption. In this case, a reverse bias is applied between the second and third electrodes 43 and 45, respectively, and the active layer 13 may absorb light as responding to the signal applied therebetween.

Figure 4:
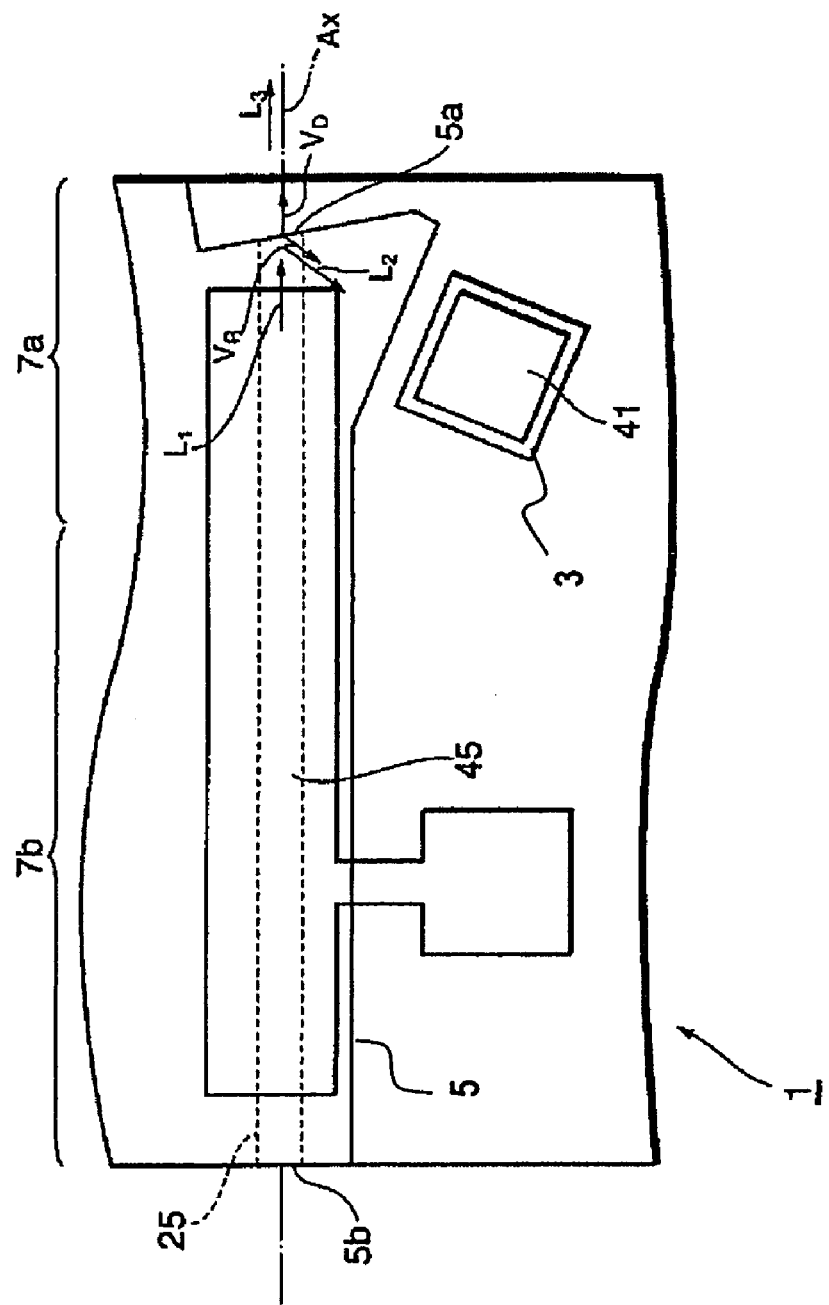
FIG. 4 is a plan view of the optical device.

FIG. 4 is a plan view showing the semiconductor optical device 1 shown in previous drawings from FIG. 1 to FIG. 3. The substrate 7 includes a first region 7a and a second region 7b arranged along the axis $A_X$. The optical waveguide 5 is formed in both regions 7a and 7b, while the optical detector 3 is arranged only in the first region 7a.

As previously explained, the light $L_1$ generated in the active layer 13 is partly reflected at the first end surface 5a and becomes the light 12 to reach the optical detector 3. The rest part $L_3$ of the light $L_1$ passes through the first end surface 5a and is emitted therefrom. Since the first surface 5a is inclined to the axis $A_X$, the light $L_2$ reflected at the first end surface 5a does not return to the active layer, and advances to the optical detector 3.

The absorption layer 9 has a photo-luminescence wavelength longer than that of the first active layer. That is, the fundamental absorption edge of the absorption layer is smaller than that of the first active layer 13, accordingly, the absorption layer 9 can absorb light emitted from the first active layer 13. Moreover, temperature dependence of the absorption co-efficient, which is equivalent to the sensitivity of the optical detector 3, is generally greater as the wavelength approaches the fundamental absorption edge from the longer wavelength side. Since the wavelength of the light emitted from the active layer 13 is shorter than that corresponding to the fundamental absorption edge, temperature dependence of the optical detector 3 at the wavelength of light emitted from the first active layer 13 is smaller than that corresponding to the fundamental absorption edge.

The following table I shows an exemplary configuration of layers in the present embodiment:

TABLE I

Exemplary configuration of layers

| Layer | | Type | Dopant | Material |
|---|---|---|---|---|
| 7 | Substrate | n | | InP |
| 9 | Absorption Layer | undope | | InGaAs |
| 11 | Semiconductor Layer | p | Zn | InGaAs |
| 13 | Active Layer | undope | | InGaAsP |
| 15 | n-Cladding Layer | n | | InP |
| 17 | p-Cladding Layer | p | | InP |
| 33 | p-Cladding Layer | p | | InP |
| 35 | Contact Layer | p | | InGaAs |
| 31a | First Buried Layer | p | | InP |
| 31b | Second Buried Layer | n | | InP |

In the table listed above, the first and second semiconductor layers 31a and 31b, respectively may be made of InP doped with iron (Fe), which shows a semi-insulating characteristic.

The optical semiconductor device 1 may be formed as follows: (a) First, a plurality of semiconductor lasers 13, 15 and 17 including the first active layer 13 are grown on the semiconductor substrate 7 by an epitaxial growth technique, such as Organo-Metallic Vapor Phase Epitaxy (OMVPE). (b) After the epitaxial-growth, the second mesa 25 is etched to form a stripe of the second mesa 25 by using an insulating film as an etching mask, which covers a region where the second mesa 25 is formed. (c) Two semiconductor layers of p-type InP 31a and n-type InP 31b are sequentially grown to bury the stripe, and the buried region 31 is finally etched to form the mesa of the optical waveguide 5.

(d) Next, another plurality of semiconductor layers 9 and 11 are sequentially grown on the exposed area, which is formed by the etching for making the waveguide mesa. (e) The p-type InP layer 33 and highly doped p-type InP layer 35 are grown on the waveguide mesa, i.e., on the buried region 31 and the second mesa 25. (f) Finally, the semiconductor layers 9 and 11 for the optical detector 3, and the buried region 31 are dry-etched with using an insulating film as an etching mask, which makes two mesas for the optical detector 3 and the waveguide 4, and the groove 39 therebetween.

(g) After the etching, a passivation film 47 such as silicon die-oxide ($SiO_2$) is covered whole of the semiconductor wafer. The end surface 5a of the optical waveguide, which is inclined to the unit vector of the optical waveguide 5, is completed by etching the end portion of the waveguide by about 15 μm depth from the end thereof by using a composite mask of photo-resist/titanium/photo-resist. The tilt angle of the end surface 5a to the axis $A_X$ is about 8° in this example, preferably from 7° to 12°. In the case of a small angle, a portion of light reflected to the optical waveguide may be greater, which is equivalent that an enough power may not obtain for the optical power monitoring at the optical detector 3. On the other hand, in a case the angle becomes greater, not only the optical output passing through the end surface becomes smaller, but also the angle of the optical output to the end surface 5a becomes greater.

(Second Embodiment)

Figure 5:
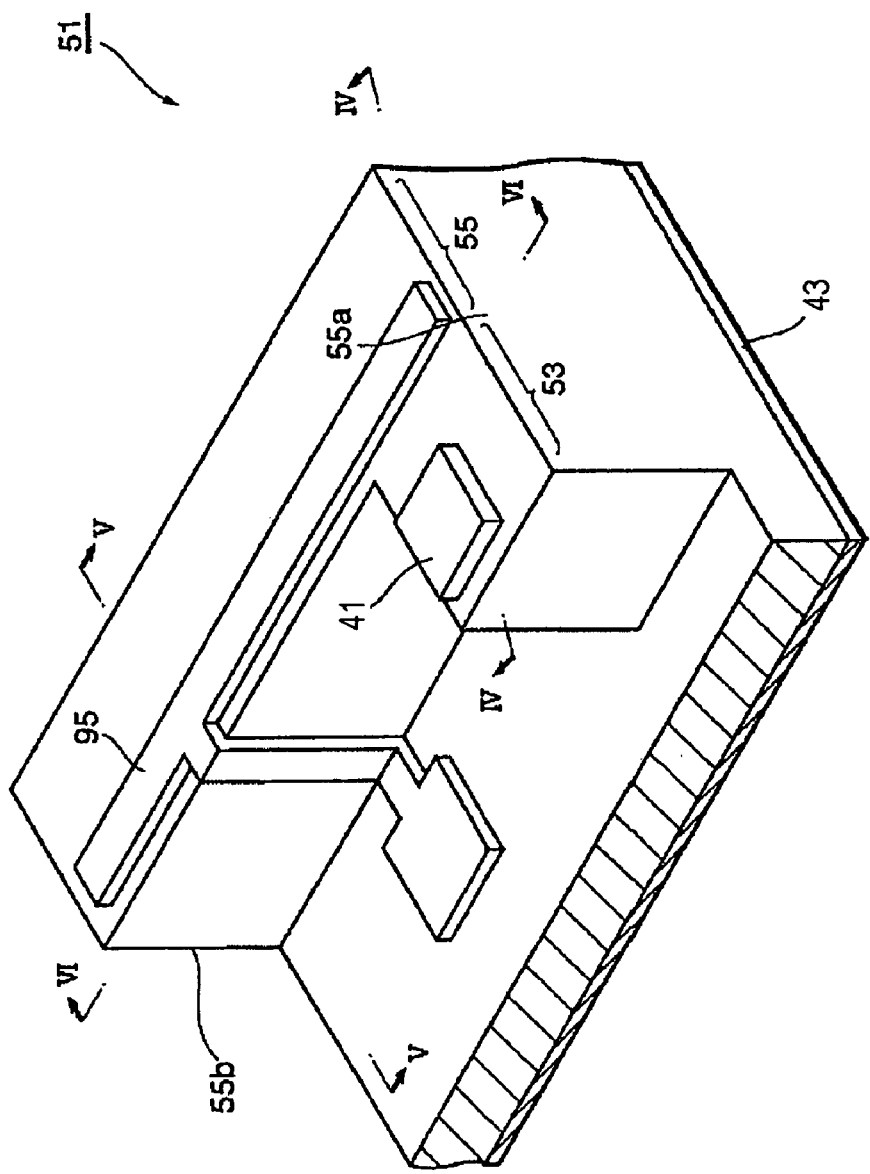
FIG. 5 is a perspective view showing an optical device according to the second embodiment of the invention.
Figure 6:
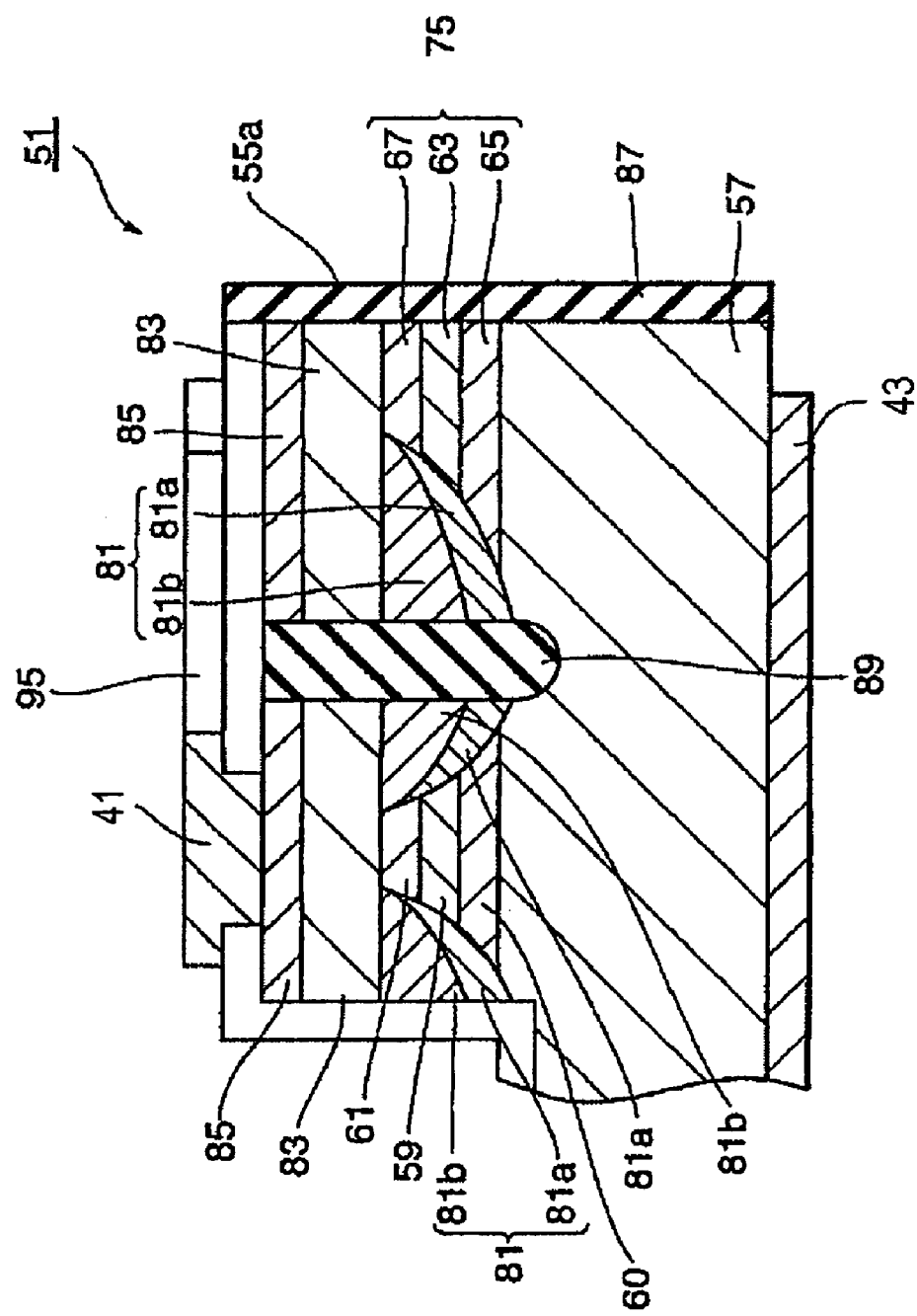
FIG. 6 is a cross sectional view showing the optical device taken along the ling IV—IV shown in FIG. 5.
Figure 7:
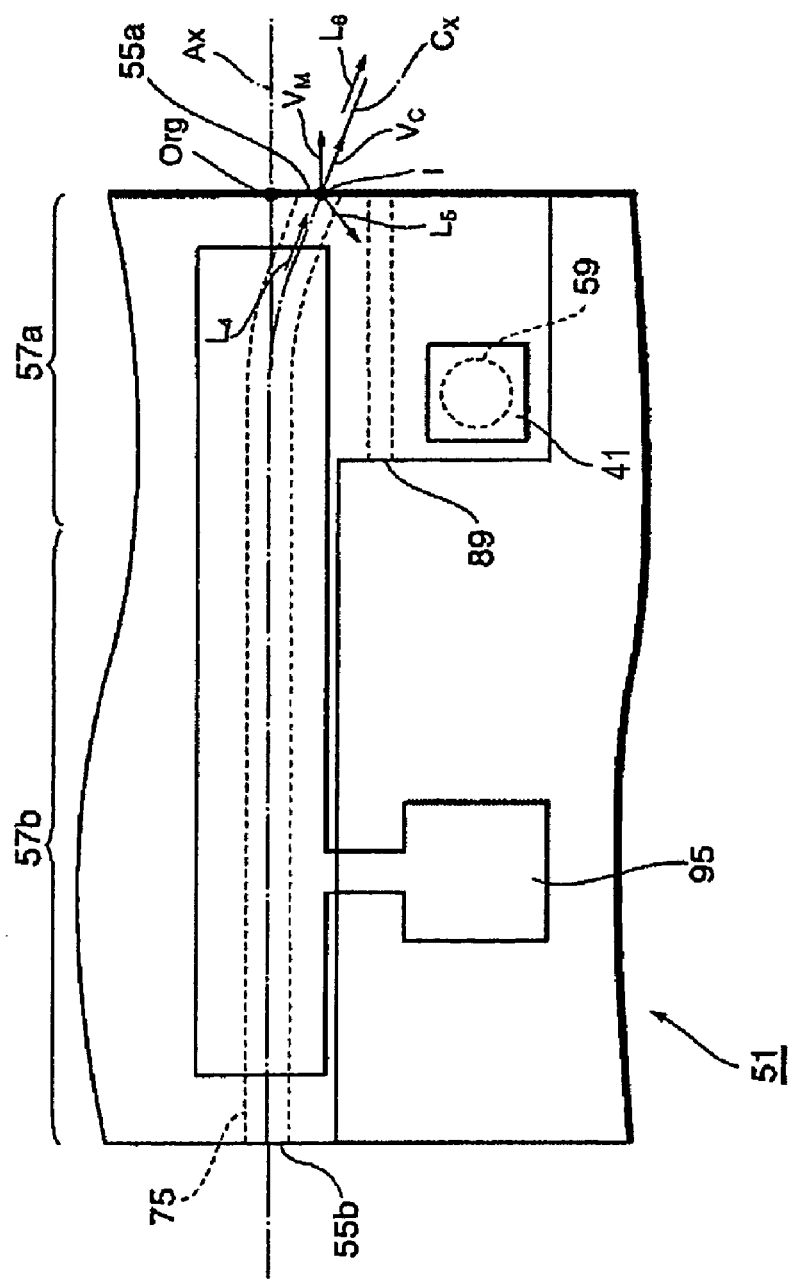
FIG. 7 is a plan view of the optical device according to the second embodiment of the invention.

FIG. 5 is a view showing a semiconductor optical device 51 according to the second embodiment of the present invention, FIG. 6 is a cross section taken along the ling IV—IV in FIG. 5 and FIG. 7 is a plan view of the optical device 51.

A cross section taken along the line V—V is substantially equivalent to that shown in FIG. 2B, and another cross section along the axis $A_X$ in FIG. 5 is substantially equal to the cross section shown in FIG. 3.

Next describes the second embodiment for portions different to those appeared in the first embodiment shown in figures from 1 to 4. As shown in FIG. 7, the optical semiconductor device 51 of the present invention provides an optical waveguide 55 curved in the first region 57a of the substrate 57. That is, the substrate 57 of the optical device 51 is sectioned into the first region 57a and the second region 57b along the axis $A_X$. The axis $C_X$, which is centered in the active layer 63, i.e. the center of the second mesa 75 and the axis $C_X$ bends as the waveguide 55 bends in the first portion 57a to intersect the first end surface 55a at the point I. Due to this bending of the optical waveguide 55, the unit vector $V_C$ of the axis $C_X$ at the point I makes an angle to the normal vector $V_M$ of the first end surface 55a. Therefore, the light reflected at the first end surface 55a advances to the optical detector 3 not returns to the optical waveguide 55.

That is, the light $L_4$ generated in the active layer 63 propagates the optical waveguide 55 and reaches the first end surface 55a thereof. A portion $L_5$ of thus propagated light $L_4$ is reflected at the first end surface 55a and reaches the absorption layer 59 of the optical detector. Another portion $L_4$ of the light $L_4$ passes the first end surface 55a and output therefrom.

As shown in FIG. 7, the unit vector $V_C$ of the axis $C_X$ at the point I makes an angle, preferably greater than 3°, to the normal vector $V_M$ of the first end surface 55a. Further, the first end surface may be covered by an insulating film 87, which passivates the surface of the end surface 55a. By adjusting composition and thickness of the insulating film, the reflectivity and the transmittance of the end surface 55a may be varied to optimize the ratio of the optical power of the reflected light to that of the transmitted light.

In the present embodiment, the composition of the first active layer 63 and the absorption layer 59 may be substantially equal to each other. Accordingly, the manufacturing step for the optical device 51 may be decreased.

The optical device 51 provides an isolation region 89 between the waveguide 55 and the optical detector 53. The isolation region 89 reaches to the substrate 57 penetrating two semiconductor layers 83 and 85. The resistively of the isolation region 89 is greater than that of semiconductor layers 83 and 85 and that of the buried region comprised of two semiconductor layers 81a and 81b. The isolation region electrically isolates the optical waveguide 55 and the optical detector 53. The isolation region may be formed by the ion implantation technique of proton ions.

The following table II lists an examplaiy configuration of the semiconductor optical device 51 of the present embodiment:

TABLE II

Exemplary configuration of semiconductor layers appearing in the second embodiment.

| | Layer | Type | Material |
|---|---|---|---|
| 7 | Substrate | n | InP |
| 59 | Absorption Layer | undope | InGaAsP |
| 63 | Active Layer | | |
| 60 | Cathode Layer | n | InP |

TABLE II-continued

Exemplary configuration of semiconductor layers appearing in the second embodiment.

| Layer | | Type | Material |
|---|---|---|---|
| 65 | n-Cladding Layer | | |
| 61 | Anode Layer | p | InP |
| 67 | p-Cladding Layer | | |
| 83 | p-Cladding Layer | p | InP |
| 85 | Contact Layer | p | InGaAs |
| 81a | First Buried Layer | p | InP |
| 81b | Second Buried Layer | n | InP |

The semiconductor optical device 51 may be formed as follows: First, a plurality of semiconductor layers is grown on both the first and second portions, 57a and 57b, respectively, of the substrate 57 for the optical detector 53 and the waveguide 55. In the present embodiment, the mesa for the optical waveguide 55, which is a stripe shape, and that for the optical detector 53 are formed by etching in one time. That is, using an etching mask whose shape in the optical waveguide is bent, the stripe for the optical waveguide and for the optical detector are formed. The angle of the stripe to the normal line of the end surface 55a is preferably greater than 3°, and it is 8° in the present embodiment. The stripe and the mesa for the optical detector 53 are buried by two buried layers of the p-type InP 81a and the n-type InP 81b. On the stripe, the mesa for the optical detector 53 and the buried region 81, the p-type InP for the upper cladding layer and the highly doped p-type InGaAs for the contact layer are sequentially grown. Finally, proton ions are implanted between the optical waveguide 55 and the optical detector 53 to form the isolation region 89.

(Third Embodiment)

Figure 8:
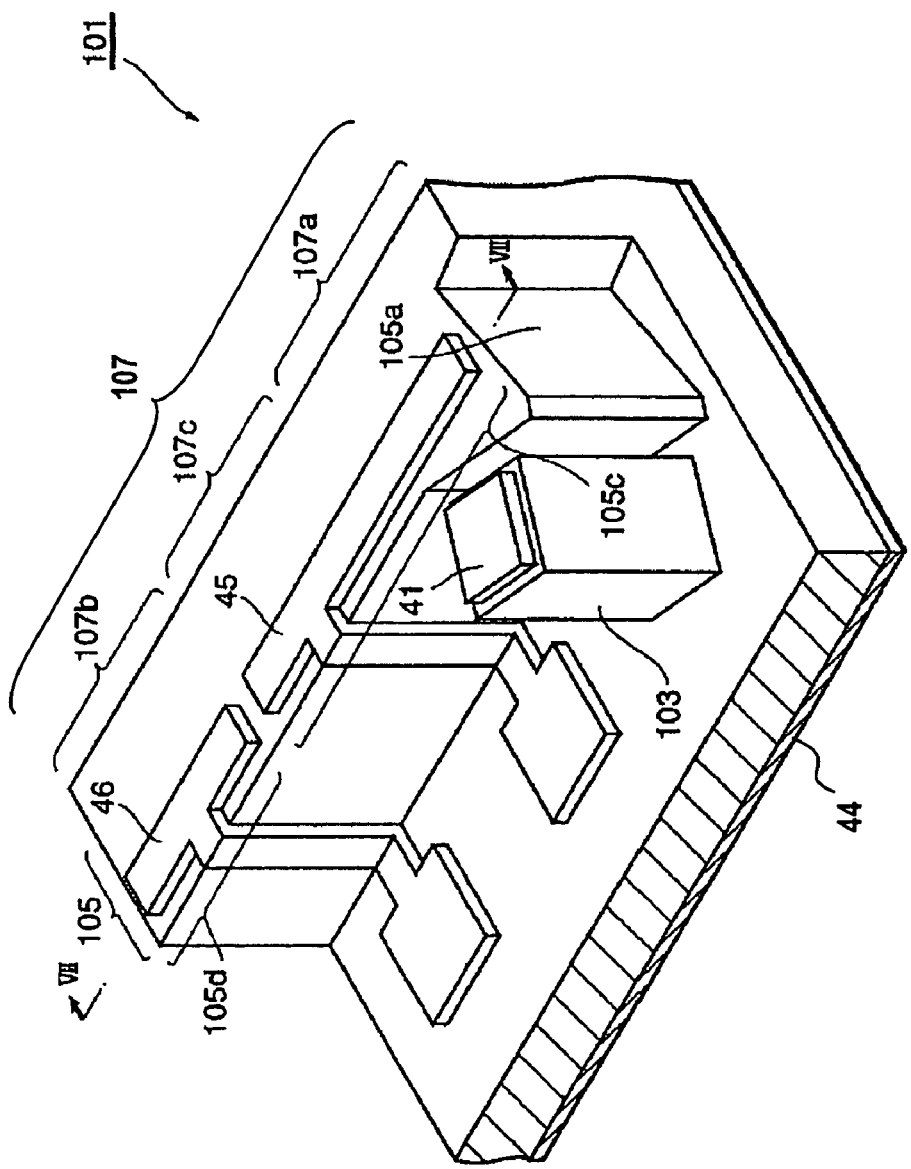
FIG. 8 is a perspective view shown the third embodiment of the invention.
Figure 9:
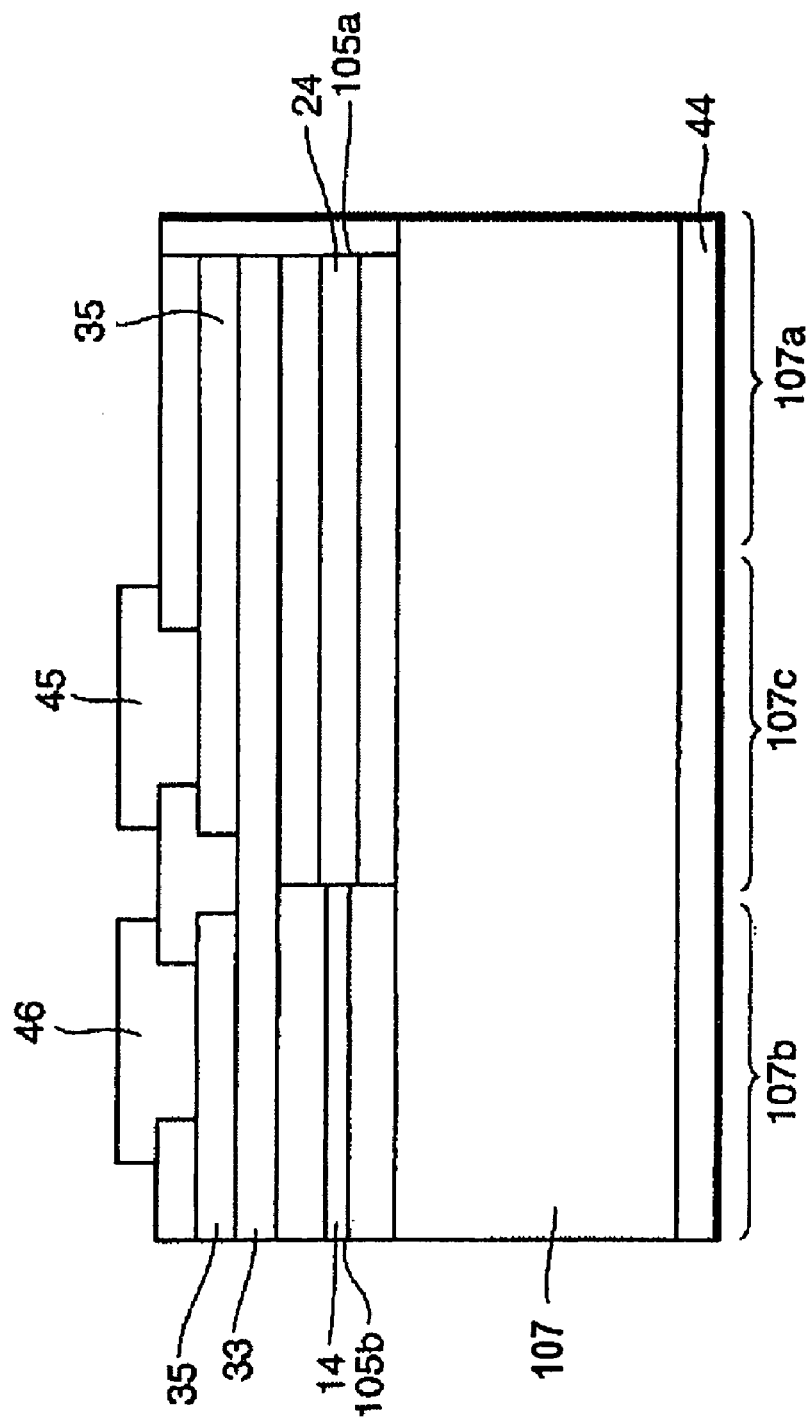
FIG. 9 is a cross sectional view of the optical device shown in FIG. 9 taken along the line VII—VII in FIG. 8.

FIG. 8 is a view showing a third embodiment of the present invention, and FIG. 9 is a cross section taken along the line VII—VII in FIG. 8.

The optical device 101 of the present embodiment also provides an optical detector 103 and an optical waveguide 105. The arrangement of the optical detector 103 is the same as those shown in the first embodiment. The substrate 107 is divided into three portions, i.e., the first 107a, the second 107b and the third 107c portions between the first 107a and the second 107b portions. The first portion 107a provides the optical detector 103 and the optical waveguide 105, the third portion 107c provides the optical waveguide 105 and the second portion provides an optical waveguide similar to the other waveguide 105.

Further, as shown in FIG. 9, the first 107a and the third 107c portions may provide the common waveguide 105c, which include the first active layer 24, while the second portion 107b provides the other waveguide 105d that includes the second active layer 14. The photoluminescence wavelength, which corresponds to the wavelength where the maximum photoluminescence is obtained, of these two active layer 14 and 24 are different to each other. On the other waveguide 105d in the second portion 107b forms an electrode 46, and the back surface of the substrate 107 provides another electrode 44 commonly used in two optical waveguides 105c and 105d. One of the waveguides may be an optical modulator, while the other of the waveguides may be a light-emitting device.

(Fourth Embodiment)

Figure 10:
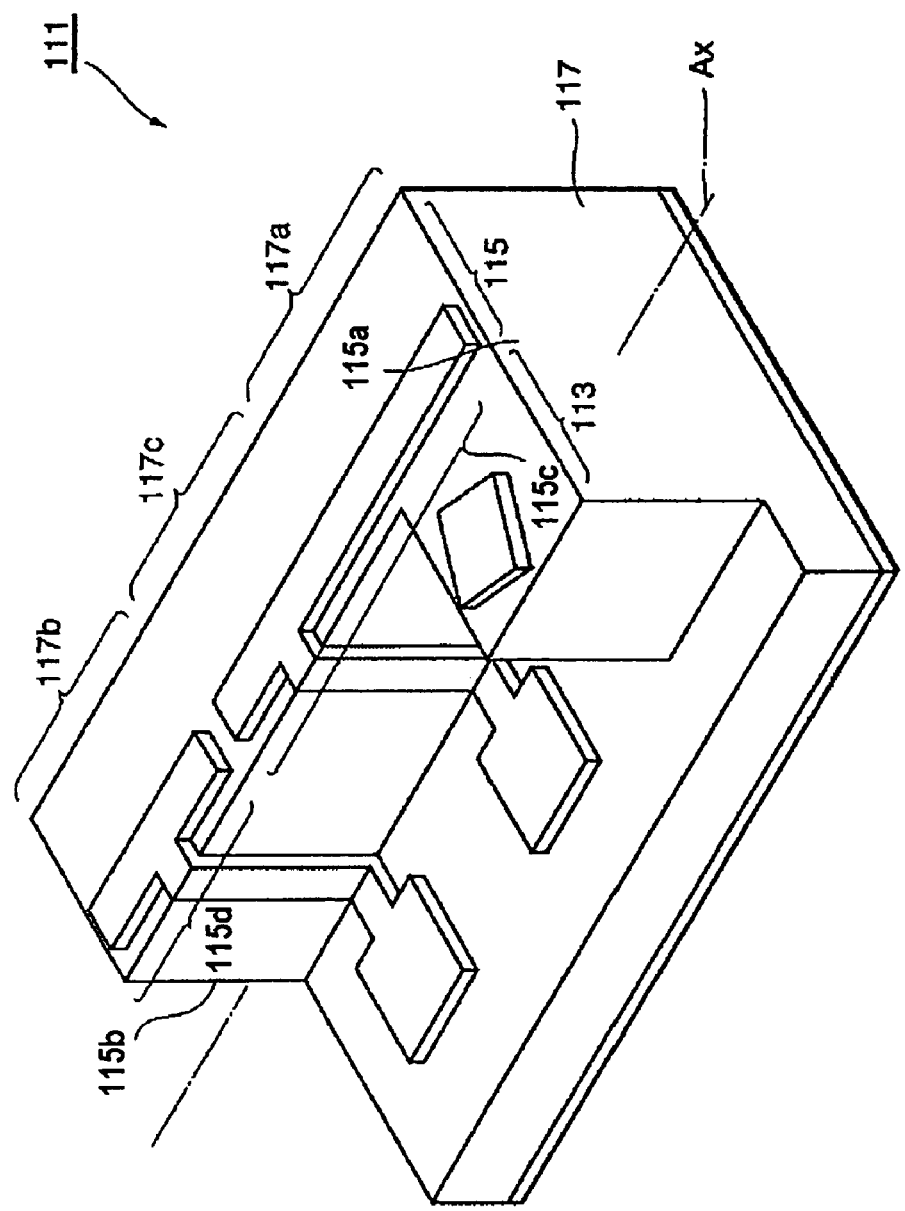
FIG. 10 is a perspective view of the optical device according to the fourth embodiment of the invention.

FIG. 10 shows another embodiment of the invention modified from the second embodiment previously shown. This optical device further includes another waveguide 105d in addition to configurations provided in the second embodiment.

The optical device 111 includes first to third regions 117a to 117c, respectively, on the substrate 117. The third region 117c is disposed between the first and the second regions, 117a and 117b. The first region 117a includes the optical detector 113 and the optical waveguide 115, the third region includes the optical waveguide 115, the waveguide and the optical detector are previously explained in the second embodiment, and the second region includes an optical waveguide similar to the previously appeared waveguide 115.

Further, the optical waveguide 115 provides first and second portions 115c and 115d, respectively, along the axis $A_X$. An optical modulator having a type of electro-absorption is formed in the first portion 115c. In the optical device thus configured, the light generated in and emitted from the active layer 14 in the second portion 117b is modulated by the optical modulator formed in both first and third regions, 117a and 117c, and reaches the first end surface 115a. The configuration that a portion of the light reached thereto is reflected by the end surface 115a and advances the optical detector 113 is the same as those explained in first to third embodiments.

(Fifth Embodiment)

Figure 11:
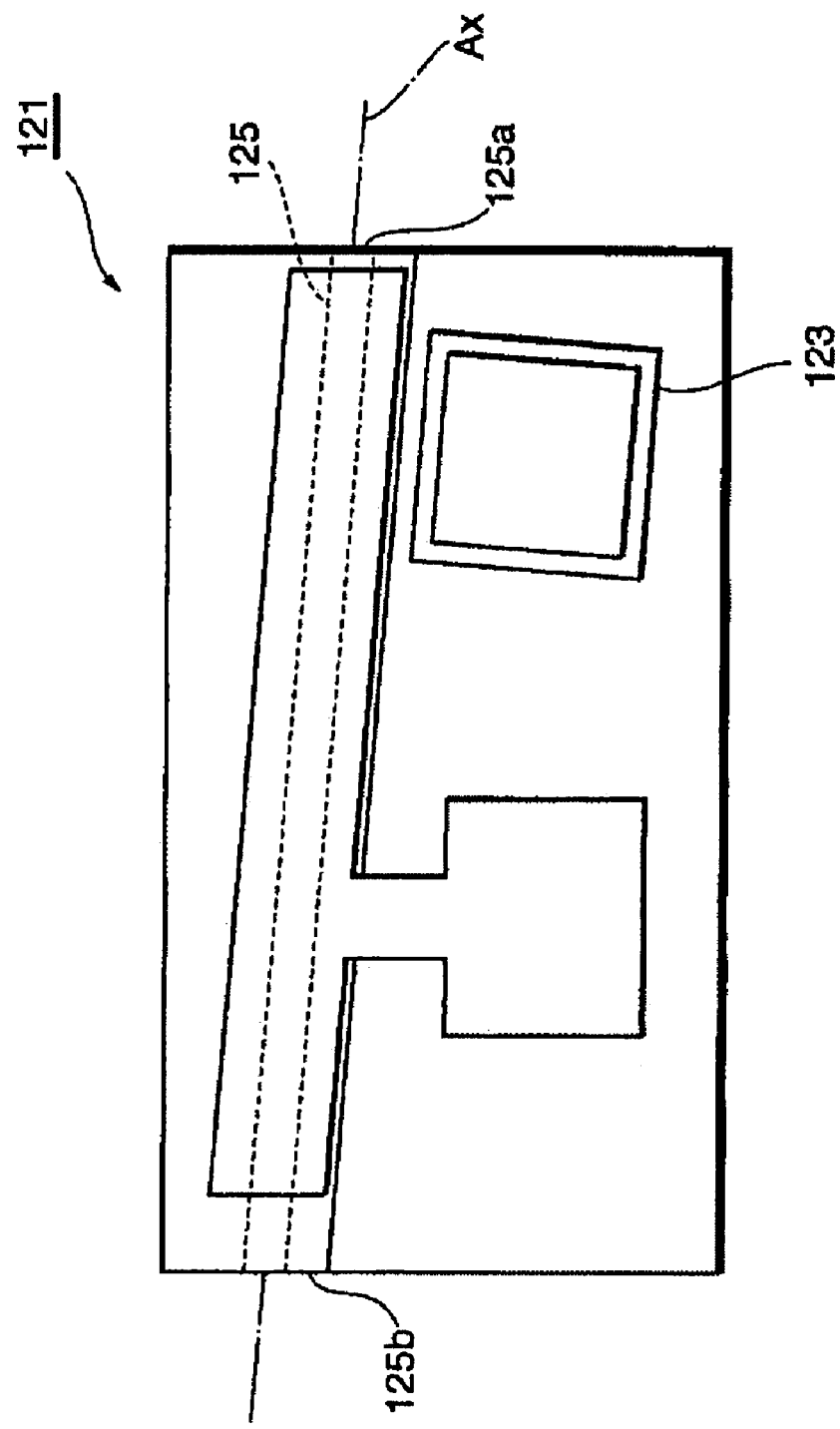
FIG. 11 is a plan view showing the fifth embodiment of the invention.

FIG. 11 shows another semiconductor optical device according to the fifth embodiment of the invention. The optical device 121 provides two end surfaces 125a and 125b substantially parallel to each other. The optical waveguide of the present invention extends substantially linearly along the axis $A_X$ that intersects both end surfaces 125a and 125b, and preferably makes an angle greater than 3° to the normal vector of the end surface 125a. The configuration where the portion of light reflected at the end surface 125a enters the optical detector 123 is similar to those shown in the previous embodiments. Further, the optical device 121 may further include an optical modulator in addition to the optical waveguide 125.

(Sixth Embodiment)

Figure 12A:
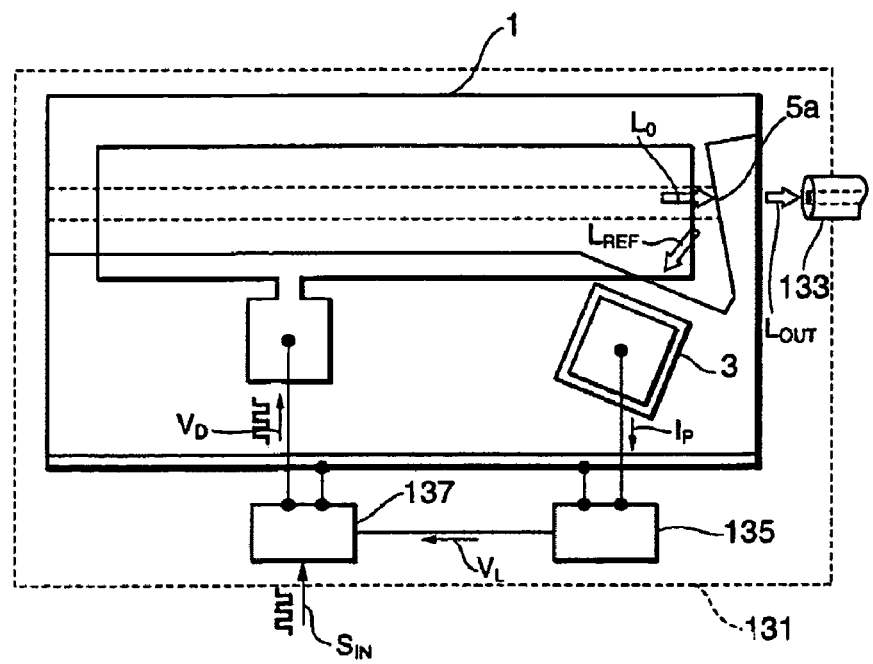
FIG. 12A is a block diagram of a light-emitting apparatus using the semiconductor optical device shown in figures from FIG. 1 to FIG. 11.
Figure 12B:
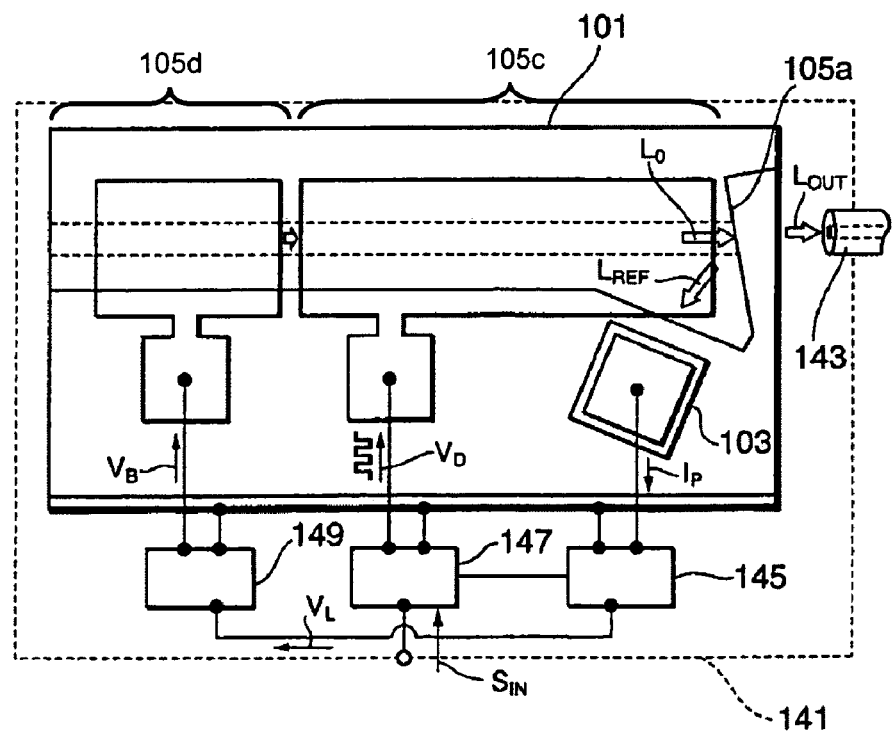
FIG. 12B is a block diagram of a light-emitting apparatus using the optical device shown in previous drawings.

FIG. 12A and FIG. 12B show block diagrams of light-emitting apparatus using the semiconductor optical device described in previous embodiments.

The light-emitting apparatus 131 includes the semiconductor optical device 1, an optical waveguide 133 such as an optical fiber, a monitor circuit 135 and a driver circuit 137. The light $L_O$ generated in the waveguide of the optical device 1 propagates therein and reaches the end surface 5a. A portion of the light becomes the light $L_{REF}$ reflected by the end surface 5a, while the rest of the light passes through the end surface 5a and becomes an optical output $L_{OUT}$. The optical detector 3, receiving the light $L_{REF}$, generates a current $I_P$, which corresponds to the magnitude of the light. The monitor circuit 135 provides a signal $V_L$ to the driver circuit 137, which signal corresponds to the current $I_P$ and denotes the fluctuation of the magnitude of the light. The driver circuit 137, receiving thus provided $V_L$ and a signal $S_{IN}$ provided outside, outputs a driving signal $V_D$ to the optical device 1. In the present apparatus 131, the optical device 1 maybe controlled in the output power thereof by using a forward output light, i.e., a portion of the light emitted from the front end surface 5a is provided to the monitor circuit.

FIG. 12B shows another light-emitting apparatus 141. This apparatus 141 includes the semiconductor optical device 101, the optical waveguide 143 such as optical fiber, a monitor circuit 145, first driver circuit 147 for the optical modulator 105c, and a second driver circuit 149 for the light-emitting device 105d. The light $L_o$ generated in the light light-emitting device 105d propagates in the optical modulator and reaches the first end surface 105a. A portion of the light is reflected by the end surface 105a to become the monitored light $L_{REF}$, while the rest of the light passes through the end surface to become the output light $L_{OUT}$. The optical detector 103, receiving the monitored light $L_{REF}$, generates a current $I_P$. The monitor circuit 145, inputting the current $I_P$, provides the signal $V_L$ reflecting the fluctuation of the light $L_{OUT}$ to the second driver circuits 149. The first driver circuit 147, receiving the signal $S_{IN}$ from the outside, provides the modulation signal $V_D$ to the optical modulator 105c, while the second driver circuit 149, receiving the signal $V_L$ from the monitor circuit 145, provides a bias signal $V_B$ to the light-emitting device 105d. In the present embodiment, the magnitude of the optical output maybe controlled by the closed loop of the light-emitting device 105d, the optical detector 145 and the second driver circuit 149. Further, since the optical detector 145 monitors the portion of the output light $L_{OUT}$, the magnitude of the output light $L_{OUT}$ can be precisely controlled.

What is claimed is:

1. A semiconductor optical device, comprising:
   an optical detector including an absorption layer formed in a second mesa;
   an optical waveguide including an active layer, a first end surface, a second end surface and an optical axis connecting said first end surface to said second end surface, said active layer being formed in a first mesa and generating light, said first end surface having a normal line; and
   a substrate for integrally disposing said first mesa and said second mesa,
   wherein said normal line of said first end surface makes an angle with said optical axis such that light generated in said active layer is partially reflected within a plane substantially in parallel to said active layer and to said substrate by said first end surface and directly enters said absorption layer of said optical detector without further reflection, and
   wherein said first mesa and said second mesa are electrically isolated from each other by a groove that is formed therebetween and that extends down to said substrate.

2. The semiconductor optical device according to claim 1, wherein said angle between said normal line of said first end surface and said optical axis is greater than 3°.

3. The semiconductor optical device according to claim 1, wherein said optical waveguide is bent at a side of said first end surface such that said normal line of said first end surface makes said angle to said optical axis of said optical waveguide, and
   wherein a normal line of said second end surface is in parallel to said optical axis.

4. The semiconductor optical device according to claim 3, wherein said first end surface is formed by etching.

5. The semiconductor optical device according to claim 1, wherein a photoluminescence wavelength of said active layer is shorter than a photoluminescence wavelength of said absorption layer.

6. The semiconductor optical device according to claim 1, wherein said absorption layer of said optical detector and said active layer of said optical waveguide are both made of InGaAsP and concurrently formed such that said absorption layer and said active layer have a same composition.

7. The semiconductor optical device according to claim 1, wherein said optical waveguide includes first and second optical waveguides and said active layer includes a first active layer included in said first optical waveguide and a second active layer included in said second optical waveguide, said first end surface being included in said first optical waveguide and said second end surface being included in said second optical waveguide, and
   wherein said second active layer generates light and said first active layer modulates light generated in said second active layer.

8. The semiconductor optical device according to claim 7, wherein a composition of said second active layer is substantially equal to a composition of said first active layer.

9. The semiconductor optical device according to claim 7, wherein said first optical waveguide is a type of electro-absorption modulator.

10. A semiconductor optical device, comprising:
    an optical detector including an absorption layer;
    an optical waveguide including an active layer, a first end surface, a second end surface and an optical axis connecting said first end surface to said second end surface, said active layer generating light and said first end surface including a normal line; and
    a substrate for integrally disposing said optical detector and said optical waveguide,
    wherein said normal line of said first end surface makes an angle with said optical axis of said optical waveguide such that light generated in said active layer is partially reflected by said first end surface within a plane substantially in parallel to said active layer and said absorption layer, and enters said absorption layer of said optical detector, and
    wherein said optical detector and said optical waveguide are electrically isolated from each other by a region implanted by proton ions.

11. A light-emitting apparatus, comprising:
    a semiconductor optical device including,
    a second waveguide for emitting light,
    a first waveguide for modulating light emitted from said second waveguide, said first waveguide including an end surface with a normal line, said first and second waveguides being formed in a first mesa and having a common optical axis with a substantial angle to said normal line of said end surface for partially reflecting light modulated in said first waveguide,
    an optical detector for monitoring light partially reflected by said first end surface, said optical detector being formed in a second mesa electrically isolated from said first mesa by a groove;
    a monitoring circuit connected to said optical detector;
    a first driver connected to said first waveguide to modulate light generated in said second waveguide by receiving a modulation signal and an output from said monitoring circuit; and
    a second driver connected to said second waveguide to drive said second waveguide by receiving output from said monitoring circuit such that output from said monitoring circuit is held constant,
    wherein said first and second mesas are integrally formed on a semiconductor substrates, and
    wherein said groove to isolate said first and second mesas extends down to said semiconductor substrate.

12. The light-emitting apparatus according to claim 11, wherein said first end surface is formed by etching.

13. The light-emitting apparatus according to claim 11, wherein said angle between said optical axis and said normal line is greater than 3°.

* * * * *